United States Patent
Natsumeda et al.

(10) Patent No.: US 6,967,551 B2
(45) Date of Patent: Nov. 22, 2005

(54) MAGNETIC FIELD ANALYZING METHOD AND DEVICE THEREFOR

(75) Inventors: Mitsutoshi Natsumeda, Osaka (JP); Hirofumi Takabayashi, Osaka (JP)

(73) Assignee: Neomax Co., Ltd., Osaka (JP)

( * ) Notice: Subject to any disclaimer, the term of this patent is extended or adjusted under 35 U.S.C. 154(b) by 67 days.

(21) Appl. No.: 10/501,781

(22) PCT Filed: Sep. 30, 2003

(86) PCT No.: PCT/JP03/12558

§ 371 (c)(1),
(2), (4) Date: Jul. 16, 2004

(87) PCT Pub. No.: WO2004/031997

PCT Pub. Date: Apr. 15, 2004

(65) Prior Publication Data
US 2005/0151609 A1  Jul. 14, 2005

(30) Foreign Application Priority Data

Oct. 4, 2002 (JP) ............................. 2002-291990

(51) Int. Cl.$^7$ ............................................. H01F 13/00
(52) U.S. Cl. ...................... 335/284; 335/302; 335/306; 361/148
(58) Field of Search . 335/284, 302–306; 361/147–148

(56) References Cited

U.S. PATENT DOCUMENTS 5,041,172 A * 8/1991 Tokunaga et al. ........... 148/302

FOREIGN PATENT DOCUMENTS

| JP | 09-051700 | 2/1997 |
| JP | 2002-328956 | 11/2002 |
| JP | 2002-328957 | 11/2002 |
| JP | 2003-242199 | 8/2003 |

OTHER PUBLICATIONS

Yasuto Taniguchi et al., "Magnetic Field Analysis of a Permanet Magnet Motor with a Skewed Rotor Using the Finite Element Method and a 3-D Mesh Coupling Method", URL: http://www.jri.co.jp/pro-eng/jmag/analysis/paper/skew.pdf.

* cited by examiner

*Primary Examiner*—Ramon M. Barrera

(74) *Attorney, Agent, or Firm*—Keating & Bennett, LLP

(57) ABSTRACT

A method and apparatus for magnetic field analysis, contributing to not only determining whether or not demagnetization would occur in a permanent magnet but also calculating its magnetic flux density distribution after the demagnetization, is provided. In a magnetic field analysis method according to the present invention, first, permeance coefficients at multiple sites in a permanent magnet and/or numerical values that are dependent on the permeance coefficients are calculated based on B-H curve data of the permanent magnet at a first temperature T1. Next, modified B-H curve data of the permanent magnet, which has been operated at a second temperature T2 that is different from the first temperature T1, are derived for the respective sites based on B-H curve data of the permanent magnet at the second temperature T2 and the permeance coefficients or the numerical values.

12 Claims, 7 Drawing Sheets

MAGNETIC LINES OF FORCE AND PERMEANCE COEFFICIENTS (a) COMPARE FLUXES (b) COMPARE DEMAGNETIZING FACTORS (i) 20°C (ii) 100°C (i) 20°C (ii) 100°C

MAGNETIC FIELD ANALYZING METHOD AND DEVICE THEREFOR

BACKGROUND OF THE INVENTION

1. Field of the Invention

The present invention relates to a method and apparatus for making a magnetic field analysis on a magnetic circuit including a permanent magnet of which the properties are subject to change due to demagnetization. The present invention also relates to a method for producing a permanent magnet by using such a method and apparatus for magnetic field analysis.

2. Description of the Related Art

Recently, to design a magnetic circuit more efficiently and to further reduce its size, magnetic field analysis has sometimes been carried out using a computer simulation technique. Such magnetic field analysis may be performed by a method such as a finite element method in which permanent magnets with various shapes are evaluated by dividing them into a huge number of very small elements (or meshes). As those magnetic field analysis techniques have been developed, it has become possible to calculate the magnetic flux density distribution or flux in a magnetic circuit with high precision. For example, a conventional magnetic field analysis method is described in the following prior art document:

Document: Yasuhito Taniguchi and four others, "Three-Dimensional Magnetic Field Analysis on Permanent Magnet Motor with Skew Considered", [online], [searched through, and found on, the Internet on Oct. 2, 2002], <URL: http://www.jri.co.jp/pro-eng/jmag/analysis/papers/skew.pdf>.

When a rare-earth permanent magnet is heated, its magnetization decreases (which is called a "demagnetization phenomenon"). Meanwhile, a ferrite magnet produces the demagnetization phenomenon when cooled. Those demagnetization phenomena include a "reversible demagnetization phenomenon" in which a magnet recovers its original magnetization when brought back to a normal temperature and an "irreversible demagnetization phenomenon" in which a magnet cannot recover its original magnetization even when brought back to the normal temperature. The magnitude of the reversible demagnetization changes linearly with the temperature of the magnet and its rate is called a "reversible temperature coefficient". On the other hand, the irreversible demagnetization refers to the decrease in magnetization that has been caused by heating or cooling but cannot be compensated for even when the magnet temperature is brought back to room temperature again.

For example, suppose a permanent magnet is used at 100° C. In that case, even if the temperature of the magnet is decreased to a normal temperature (20° C.) after the irreversible demagnetization has been produced, the magnetization of the magnet remains low and cannot recover its original level fully. Once such demagnetization has occurred, the hysteresis curve of the magnet changes its shape.

In carrying out a magnetic field analysis on a magnetic circuit including a permanent magnet, the magnetic field analysis needs to be performed with the demagnetization of the permanent magnet taken into consideration. However, a conventional demagnetization estimating method just determines whether or not demagnetization occurs in a permanent magnet under given operating conditions (such as temperature and external magnetic field). Hereinafter, this point will be described with reference to FIGS. 1 through 3.

FIG. 1 illustrates a plate-shaped permanent magnet. The permanent magnet illustrated in FIG. 1 is magnetized in its thickness direction. FIG. 2 is a cross-sectional view schematically illustrating the magnetic lines of force produced by that permanent magnet. As can be seen from FIG. 2, the magnetic paths of magnetic lines of force emitted from the vicinity of the ends of the magnet are shorter than those of magnetic lines of force emitted from the center portion of the magnet.

Once a permanent magnet has been magnetized, the permanent magnet produces an N pole and an S pole. Accordingly, as shown in FIG. 2, a magnetic flux (i.e., magnetic lines of force) is produced so as to head from the N pole toward the S pole outside of the permanent magnet. In this case, another magnetic flux heading from the N pole toward the S pole has been produced inside of the permanent magnet, too. The magnetic flux produced inside of the magnet acts in such a direction as to decrease the magnetization of the permanent magnet. This is why a magnetic field formed by such a magnetic flux is called a "demagnetizing field (self demagnetizing force)". The closer the N and S poles are, the greater the demagnetizing force. In the plate-shaped permanent magnet shown in FIG. 1, the larger the ratio of the plate thickness to the plate area, the greater the demagnetizing force.

FIG. 3 is a graph schematically showing a portion of the demagnetization curve of the permanent magnet shown in FIG. 1. As used herein, the "demagnetization curve" refers to either the second or third quadrant portion of a hysteresis curve, which is obtained by starting to change the magnetic field monotonically in a state where a permanent magnet has a saturated magnetic flux density or saturated magnetic polarization. FIG. 3 is a graph of which the ordinate represents the magnetic flux density B and the abscissa represents the external magnetic field H and shows only the second quadrant portion. In the graph shown in FIG. 3, a demagnetization curve is drawn as an approximated line. However, even if at least a portion of the hysteresis curve of a magnet is linear, that hysteresis curve will also be referred to herein as a "B-H curve".

In the graph shown in FIG. 3, a point corresponding to the demagnetizing force Hd (i.e., the operating point) is designated on the B-H curve. The magnetic flux density at this operating point is equal to Bm and the line connecting the operating point to the origin of the graph is called an "operating line". And the absolute value of the slope of the operating line is called a "permeance coefficient Pc". The magnetic flux density Bm is one of numerical values that depend on the permeance coefficient Pc.

The demagnetizing force Hd is always present no matter whether or not an external field is applied to a permanent magnet. Accordingly, the density of the magnetic flux emitted from a permanent magnet to which no external field is applied is equal to the magnetic flux density Bm corresponding to the operating point. It is generally said that the operating point of a permanent magnet changes with the shape of the magnet or its surrounding conditions. Strictly speaking, the operating point is also changeable from one position to another in the permanent magnet. That is to say, the permeance coefficient Pc of a permanent magnet is not constant in that permanent magnet but changes from one position to another in the permanent magnet.

As shown in FIG. 2, the shorter the magnetic path, the smaller the demagnetizing force Hd and the larger the permeance coefficient Pc. Stated otherwise, the longer the magnetic path, the greater the demagnetizing force Hd and the smaller the permeance coefficient Pc. For that reason, in the permanent magnet having the shape shown in FIG. 1, the permeance coefficient Pc becomes the smallest at the center of the magnet and the largest at the corners of the magnet. In FIG. 1, Pc(min) denotes a site with the minimum permeance coefficient Pc and Pc(max) denotes a site with the maximum permeance coefficient Pc.

In this manner, the permeance coefficient Pc of a permanent magnet changes according to a specific position in the permanent magnet. On the other hand, the demagnetization produces where the permeance coefficient Pc is the smallest. Thus, in the conventional magnetic field analysis method, the magnetic flux density values Bm at respective sites of a magnet (i.e., a number of finite elements) are obtained and then the permeance coefficient Pc(min) at a site with the smallest magnetic flux density Bm is calculated by a computer simulation technique. Thereafter, by comparing an operating line having such a permeance coefficient Pc(min) with a B-H curve at an operating temperature, it is determined whether or not this site can be demagnetized. Hereinafter, such a conventional demagnetization estimating method will be described with reference to FIG. 4.

FIG. 4 is a graph showing a B-H curve of a permanent magnet at a normal temperature (20° C.) as a solid curve and another B-H curve thereof at 100° C. as a dotted curve. The B-H curve data at respective temperatures are stored in a memory of a computer. After data about the shape of a permanent magnet has been fed, the operating lines are obtained for respective sites in the magnet by a finite element method.

The graph of FIG. 4 also shows two operating lines of two types of magnets C and D. The operating line C is supposed to be the operating line of a site that has the smallest permeance coefficient Pc in the magnet C, while the operating line D is supposed to be the operating line of a site that has the smallest permeance coefficient Pc in the magnet D. Also, these two magnets C and D are supposed to share the same B-H curve for the sake of simplicity.

As can be seen from FIG. 4, the intersection between the operating line C and the 20° C. B-H curve and the intersection between the operating line C and the 100° C. B-H curve are both located above the inflection points (i.e., knick points) of their associated B-H curves. Thus, it is expected that the magnet C with the greater permeance coefficient Pc(min) would not be demagnetized even under an operating environment at 100° C.

On the other hand, although the intersection between the operating line of the magnet D with the smaller permeance coefficient Pc(min) and the 20° C. B-H curve is located above the inflection point (i.e., knick point) of its associated B-H curve, the intersection between the operating line of the magnet D and the 100° C. B-H curve is located below the inflection point (i.e., knick point) of its associated B-H curve. Thus, it is judged that the magnet D with the smaller permeance coefficient Pc(min) would not be demagnetized at 20° C. but would be demagnetized at 100° C.

Such a conventional magnetic field analysis method just determines whether or not a site that has the smallest permeance coefficient in a permanent magnet is demagnetized. Accordingly, even if that portion with the smallest permeance coefficient accounted for such a small percentage of the overall permanent magnet that the demagnetization problem hardly occurs in practice, the decision could still be "demagnetization should occur".

Also, the conventional magnetic field analysis method could not give any answer to the question of what the magnetic flux density distribution would be like after the demagnetization occurred. That is to say, the conventional magnetic field analysis method just tested each magnet for the probability of occurrence of demagnetization and was unable to show, by numerical analysis, how the flux and magnetic flux density distribution would change as a result of the demagnetization.

In order to overcome the problems described above, a primary object of the present invention is to provide a method and apparatus for magnetic field analysis, contributing to not only determining whether or not demagnetization would occur in a permanent magnet but also calculating its magnetic flux density distribution after the demagnetization.

SUMMARY OF THE INVENTION

A magnetic field analysis method according to the present invention includes the steps of: calculating permeance coefficients at multiple sites in a permanent magnet and/or numerical values that are dependent on the permeance coefficients based on B-H curve data of the permanent magnet at a first temperature T1; and deriving modified B-H curve data of the permanent magnet, which has been operated at a second temperature T2 that is different from the first temperature T1, for the respective sites based on B-H curve data of the permanent magnet at the second temperature T2 and the permeance coefficients or the numerical values as stored in the memory means.

In one preferred embodiment, the modified B-H curve data is derived at a third temperature that is different from the second temperature T2.

In another preferred embodiment, the method further includes the step of storing the modified B-H curve data in a memory of a calculator.

A magnetic field analyzer according to the present invention includes memory means for storing B-H curve data of a selected permanent magnet at multiple temperatures and computing means. The computing means carries out the steps of: calculating permeance coefficients at multiple sites in the permanent magnet and/or numerical values that are dependent on the permeance coefficients based on B-H curve data of the permanent magnet at a first temperature T1 as stored in the memory means; and deriving modified B-H curve data of the permanent magnet, which has been operated at a second temperature T2 that is different from the first temperature T1, for the respective sites based on B-H curve data of the permanent magnet at the second temperature T2 and the permeance coefficients or the numerical values as stored in the memory means.

In one preferred embodiment the computing means stores the modified B-H curve data in the memory means.

A magnetic field analysis program according to the present invention is defined so as to make a computer carry out the steps of: calculating permeance coefficients at multiple sites in a permanent magnet and/or numerical values that are dependent on the permeance coefficients based on B-H curve data of the permanent magnet at a first temperature T1; and deriving modified B-H curve data of the permanent magnet, which has been operated at a second temperature T2 that is different from the first temperature T1, for the respective sites based on B-H curve data of the permanent magnet at the second temperature T2 and the permeance coefficients or the numerical values.

In one preferred embodiment, the computer is made to derive the modified B-H curve data at a third temperature that is different from the second temperature T2.

In another preferred embodiment, the computer is made to further carry out the step of storing the modified B-H curve data in a memory of a calculator.

In an additional module program for magnetic field analysis according to the present invention, a magnetic field analysis program makes a computer carry out the steps of: calculating permeance coefficients at multiple sites in a permanent magnet and/or numerical values that are dependent on the permeance coefficients based on B-H curve data of the permanent magnet at a first temperature T1; and then deriving modified B-H curve data of the permanent magnet, which has been operated at a second temperature T2 that is higher from the first temperature T1, for the respective sites based on B-H curve data of the permanent magnet at the second temperature T2 and the permeance coefficients or the numerical values.

In one preferred embodiment, the computer is made to derive the modified B-H curve data at a third temperature that is different from the second temperature T2.

In another preferred embodiment, the computer is made to further carry out the step of storing the modified B-H curve data in a memory of a calculator.

A method for producing a magnetic circuit according to the present invention includes the steps of: doing a magnetic field analysis on a magnetic circuit, including multiple permanent magnets that have been demagnetized at the second temperature T2, by any of the magnetic field analysis methods described above; and making the magnetic circuit, including selected one of the permanent magnets, based a result of the magnetic field analysis.

DETAILED DESCRIPTION OF PREFERRED EMBODIMENTS

According to the present invention, instead of paying attention to just one site of a permanent magnet that has the smallest permeance coefficient, the B-H curves of the demagnetized permanent magnet at respective sites thereof are obtained based on the permeance coefficients that have been calculated for those sites of the permanent magnet. If a permanent magnet is used under an environment that has such a high temperature (e.g., 100° C.) as to possibly produce thermal demagnetization, then the thermal demagnetization may or may not be produced according to a specific position in the permanent magnet and the degree of demagnetization also changes from one position to another. However, according to the present invention, by calculating B-H curves for respective sites of the permanent magnet, magnetic field analysis can be carried out appropriately based on a number of those B-H curves obtained. It should be noted that the operating temperature of 100° C. is just an example. As long as B-H curve data are obtained at multiple preset temperatures, the demagnetization effect may be estimated at an arbitrarily selected one of those temperatures. Such a method of estimating the degree of demagnetization effect (i.e., demagnetizing factor) can be used very effectively in designing a magnetic circuit for a permanent magnet motor in which demagnetization is likely to be produced due to a locking phenomenon.

Hereinafter, preferred embodiments of the present invention will be described with reference to the accompanying drawings.

In the following preferred embodiment, magnetic field analysis is carried out using finite elements.

Figure 1:
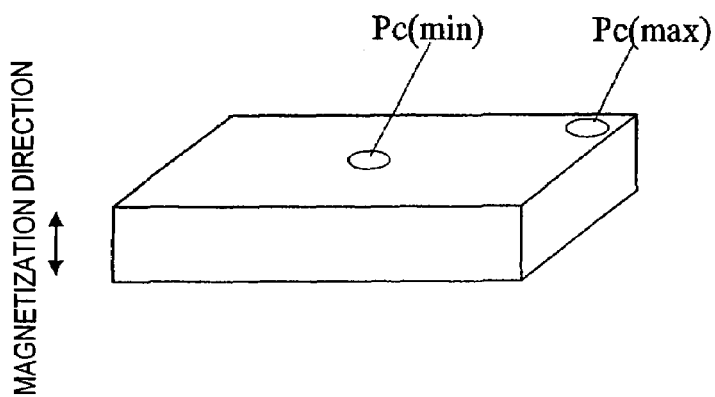
FIG. 1 is a perspective view illustrating a rectangular parallelepiped permanent magnet magnetized in the thickness direction.
Figure 2:
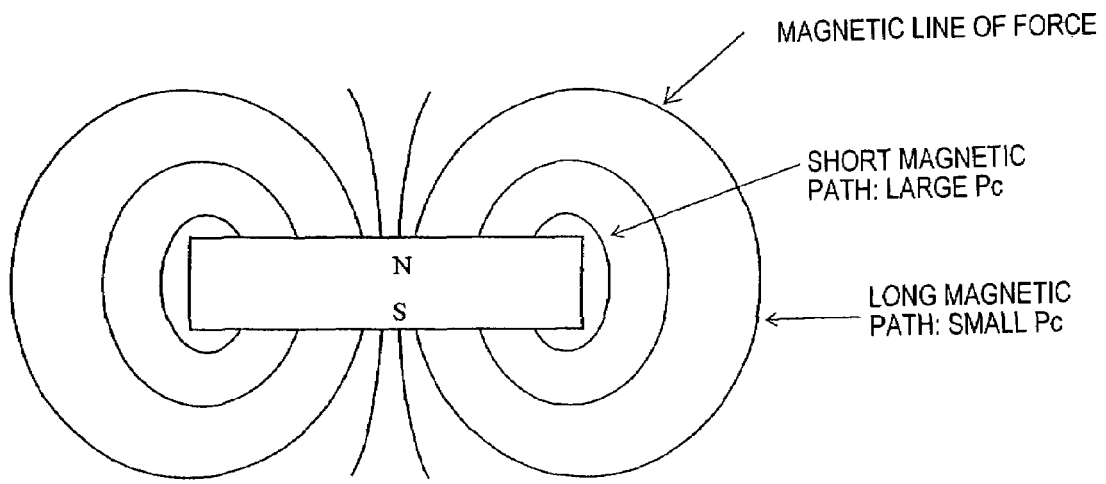
FIG. 2 is a cross-sectional view schematically illustrating the magnetic lines of force produced by the permanent magnet shown in FIG. 1.
Figure 3:
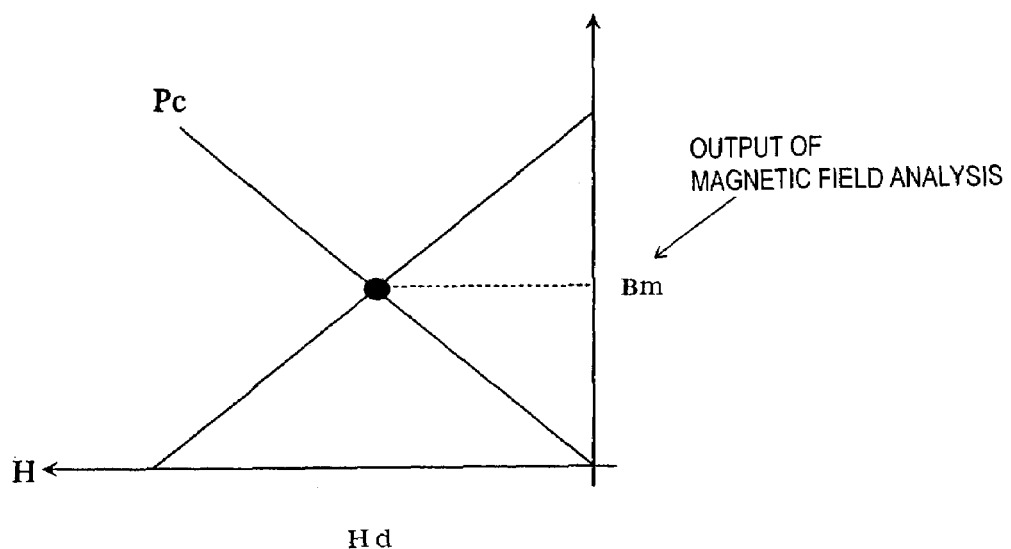
FIG. 3 is a graph schematically showing a portion of the demagnetization curve of the permanent magnet shown in FIG. 1.
Figure 4:
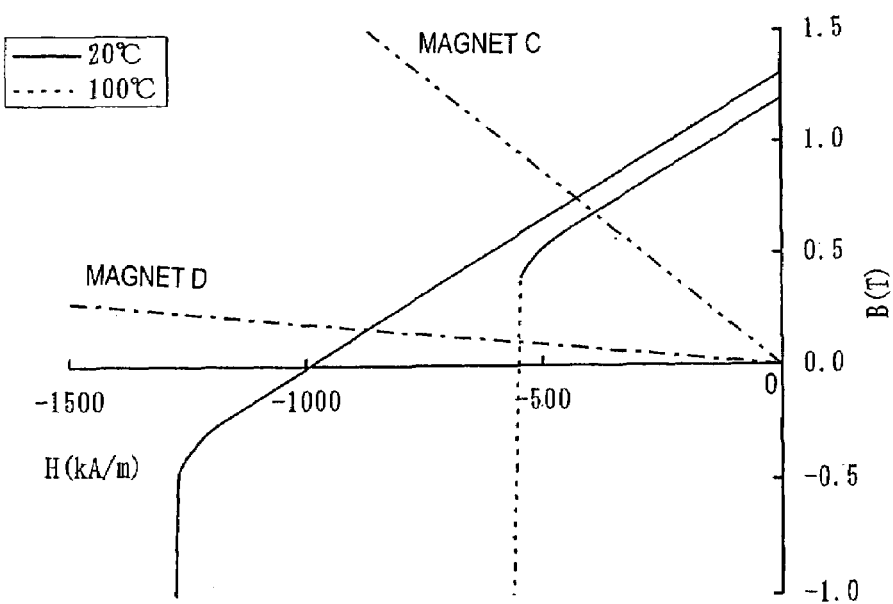
FIG. 4 is a graph showing a B-H curve of a permanent magnet at a normal temperature (20° C.) as a solid curve and another B-H curve thereof at 100° C. as a dotted curve.
Figure 5:
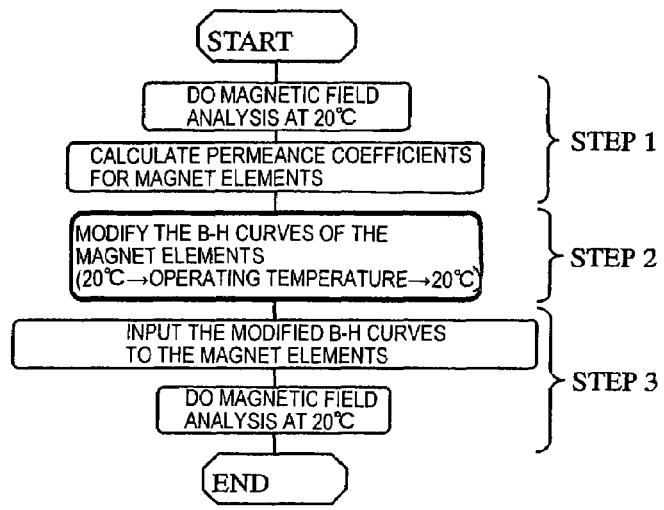
FIG. 5 is a flowchart showing the outline of a magnetic field analysis method according to the present invention.
Figure 6:
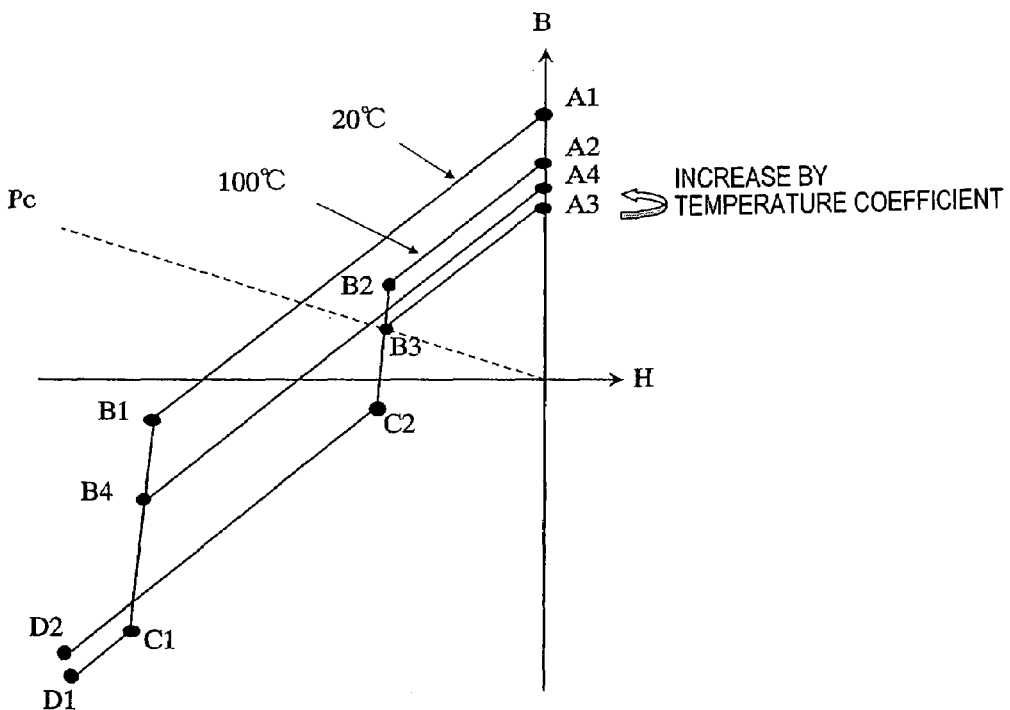
FIG. 6 shows how to modify the B-H curve in the magnetic field analysis method of the present invention.

First, the procedure of this preferred embodiment will be outlined with reference to FIG. 5.

In the first step (STEP 1), magnetic field analysis is carried out at a normal temperature (which will be referred to herein as a "first temperature T1 (e.g., 20° C.)") under the given conditions about the material and shape of the magnet. By performing this magnetic field analysis, magnetic flux density values Bm are extracted for respective sites of the magnet and their associated permeance coefficients are calculated. In this process step, a known magnetic field analysis method may be used. As computer software for magnetic field analysis, "JMAG" produced by Japan Research Institute, Ltd. may be used. This initial magnetic field analysis is preferably carried out by a finite element method in which the permanent magnet to be analyzed is divided into a number of very small elements. When the magnetic flux density values Bm of respective finite elements in the permanent magnet are obtained by a known magnetic field analysis method or analyzer, permeance coefficients Pc are obtained from those Bm values. In dividing the magnet into a number of very small elements by the finite element method, the number of divisions (i.e., the number of the finite elements=the number of meshes) may be around 100, for example. In this process step, the initial magnetic field analysis may be done with normal temperature B-H curve data for use in an ordinary magnetic field analysis. Such data may be included in a database that is attached to magnetic field analysis software on the market. Alternatively, the user of the magnetic field analysis software may collect B-H curve data separately and compile them as a database.

Next, in STEP 2, based on the permeance coefficients Pc of the respective sites (i.e., finite elements) of the magnet and the operating temperature of the magnet (which will be referred to herein as a "second temperature T2 (e.g., 100° C.)"), modified B-H curves are obtained for the respective sites of the magnet that has been subjected to thermal demagnetization at least partially. In this case, the "modification" means generating post-demagnetization B-H curve data.

Thereafter, based on the modified B-H curves for the respective sites, magnetic field analysis is carried out at another temperature (e.g., at a normal temperature of 20° C.), which is different from the second temperature T2 at which the thermal demagnetization has been produced. The magnetic field analysis at this stage is characterized by being carried out on the modified B-H curve data, not the B-H curve data included in the magnetic field analysis software mentioned above.

It should be noted that although the demagnetization may or may not occur, and the degree of that demagnetization is variable, depending on the demagnetizing force Hd and the temperature, the effects of the demagnetizing force Hd are already taken into consideration when the magnetic flux density values of the magnet are obtained during the initial analysis performed at the normal temperature of 20° C. In other words, different demagnetizing forces Hd are applied to permanent magnets of various different shapes or to respective positions in a single permanent magnet. In this example, however, different magnetic flux densities Bm, associated with those various demagnetizing forces Hd, are already obtained. For that reason, when the B-H curves for the respective finite elements of the given magnet are modified in STEP 2 in view of the demagnetization, only the thermal demagnetization, which changes with the, temperature, needs to be taken into account.

In the next STEP 3, the B-H curve data that have been obtained in the previous STEP 2 (i.e., the modified B-H curve data) are input to the respective finite elements of the magnet. Thereafter, magnetic field analysis is carried out at 20° C. (which will be referred to herein as a "third temperature T3"), for example. This magnetic field analysis is different from that of STEP 1 in the following respect. Specifically, although the same B-H curve data is used in STEP 1 to carry out magnetic field analysis on the respective finite elements of the magnet, the modified B-H curve data, which have been obtained for the individual finite elements of the magnet in view of their effects of the thermal demagnetization, are used in the magnetic field analysis of STEP 3.

Hereinafter, it will be described in further detail how to generate the post-thermal-demagnetization B-H curve data (i.e., the modified B-H curve data).

The B-H curve data is modified in the following procedure based on the permeance coefficients Pc that have been obtained through the initial analysis for the respective sites (i.e., the respective finite elements) and on the operating temperature T2 of the permanent magnet. In this example, the thermal demagnetization is supposed to have been produced when the permanent magnet was used at a temperature T2 of 100° C. In this case, the temperature T2 is higher than the first temperature T1. However, in analyzing a magnet that produces demagnetization when cooled (e.g., a ferrite magnet), the temperature T2 should be set lower than the first temperature T1.

(STEP I) First, magnetic field analysis is carried out based on the data points representing the 20° C. B-H curve (i.e., $A_1$-$B_1$-$C_1$-$D_1$), thereby calculating permeance coefficients Pc for the respective finite elements as described above. The 20° C. B-H curve data is read out from the database of magnetic field analysis software.

Also, the permeance coefficients Pc calculated are stored in the memory of a computer so as to be associated with the respective finite elements;

(STEP II) Next, data points representing a 100° C. B-H curve (i.e., $A_2$-$B_2$-$C_2$-$D_2$) are read out from the database of the magnetic field analysis software;

(STEP III) The intersection $B_3$ between the 100° C. B-H curve ($A_2$-$B_2$-$C_2$-$D_2$) and the operating line representing the permeance coefficient Pc is obtained for each of those finite elements;

(STEP IV) An equivalent remanence $B_r$ ($A_3$) at the temperature at which the thermal demagnetization was produced (i.e., 100° C. in this case) is calculated based on the value of permeability $\lambda_{rec}$ that is prestored in the database. This remanence $B_r$ ($A_3$) is also obtained for each of the multiple finite elements; (STEP V) The remanence $B_r$ ($A_4$) when the magnet temperature is brought back to the normal temperature of 20° C. (=T3) is calculated based on the equivalent $B_r$ ($A_3$) at 100° C. at which the demagnetization was produced and on a temperature coefficient. This remanence $B_r$ ($A_4$) is also obtained for each of the multiple finite elements; and (STEP VI) Data representing a B-H curve ($A_4$-$B_4$-$C_1$-$D_1$) after the magnet temperature has been brought back to the normal temperature of 20° C. are generated based on the $B_r$ ($A_4$) back at the normal temperature of 20° C. and the permeability $\lambda_{rec}$. The B-H curve data obtained in this manner are the "modified B-H curve data", which are calculated for the respective finite elements of the magnet. The modified B-H curve data are added to the database. And by carrying out magnetic field analysis based on the additional data by a known technique, the remanence distribution at an arbitrary temperature T3 after the thermal demagnetization can be easily calculated using existent magnetic field analysis software.

The respective processing steps of this magnetic field analysis are carried out by installing a program, which makes a computer execute these calculations (or computations), into the computer and by running that program. Such a program can be easily created by generating the modified B-H curve data and by combining an additional module for adding them to the database with a known magnetic field analysis software program.

A magnetic field analyzer, in which such a program has been installed, includes memory means for storing, as a database, B-H curve data of a selected permanent magnet at multiple temperatures and computing means. The computing means carries out the steps of: calculating permeance coefficients at multiple sites in a permanent magnet based on B-H curve data of the permanent magnet at a first temperature T1 as stored in the memory means; and deriving modified B-H curve data for those sites of the demagnetized permanent magnet based on B-H curve data of the permanent magnet at a second temperature T2, which is different from the first temperature T1, and the permeance coefficients as stored in the memory means. In these processing steps, similar computations may be carried out by calculating other numerical values that are dependent on the permeance coefficients (e.g., numerical values proportional to the permeance coefficients), instead of the permeance coefficients themselves. The computations may also be carried out with the reverse magnetic field included in these parameters.

In the magnetic field analysis method and magnetic field-analyzer of the present invention, when a magnetic circuit is operated under an environment in which thermal demagnetization can be produced, magnetic field analysis is carried out on multiple permanent magnet models and an appropriate one of the permanent magnets is selected in accordance with the result of the magnetic field analysis, thereby obtaining an excellent magnetic circuit at a low cost.

EXAMPLE

In this specific example, the fluxes, magnitudes of demagnetization, and magnetic flux density distributions of the following sample magnets were calculated by the magnetic field analysis method of the present invention and compared with actually measured values.

Sample Magnets

Magnet material: rare-earth permanent magnets NEO-MAX-40BH (produced by NEOMAX Co., Ltd. (formerly Sumitomo Special Metals Co., Ltd.))($B_r$=1.309 T)

Magnet dimensions: a thickness of 5 mm×a vertical length of 25 mm×a horizontal width of 79 mm Number of magnets: two (Sample Magnet A and Sample Magnet B)

These magnets were magnetized such that their magnetization direction was parallel to their thickness direction. In this example, rare-earth magnets were used, and therefore, demagnetization was produced at a temperature higher than a normal temperature.

Figure 7:
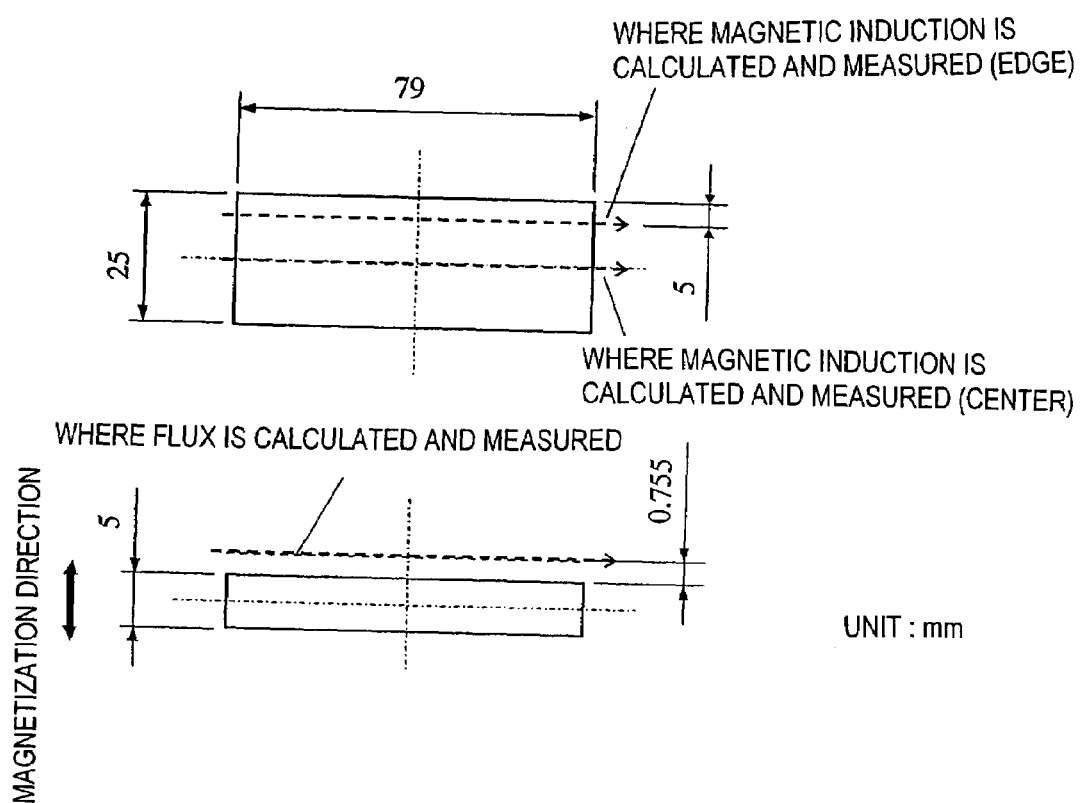
FIG. 7 shows a test model for use in a specific example of the present invention.

In comparing the values calculated by the magnetic field analysis method of the present invention with the actually measured values, the test model shown in FIG. 7 was used and the magnetic flux densities were compared at the positions shown in FIG. 7.

FIG. 8(a) shows the temperature dependences of the calculated and measured fluxes. In the graph of FIG. 8(a), the abscissa represents the operating temperature of the permanent magnet and the ordinate represents the flux. FIG. 8(b) shows the temperature dependences of the calculated and measured demagnetizing factors. In the graph of FIG. 8(b), the abscissa represents the operating temperature of the permanent magnet and the ordinate represents the demagnetizing factor. In these graphs, the calculated values are plotted as the solid circles ● and the measured values of Samples A and B are plotted as the open triangles Δ and the open squares □, respectively.

Figure 8:
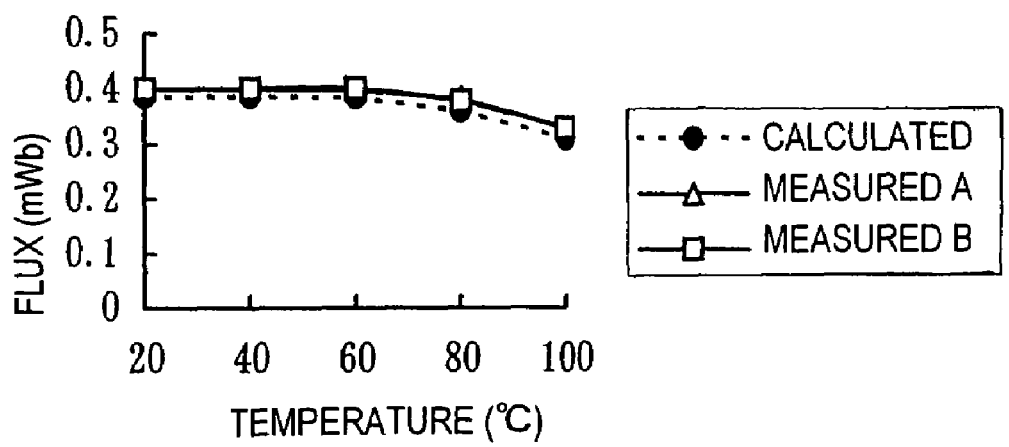
FIG. 8(a) is a graph showing the temperature dependence of a magnetic flux density obtained by calculations and measurements.
FIG. 8(b) is a graph showing the temperature dependence of a demagnetizing factor obtained by calculations and measurements.
Figure 8:
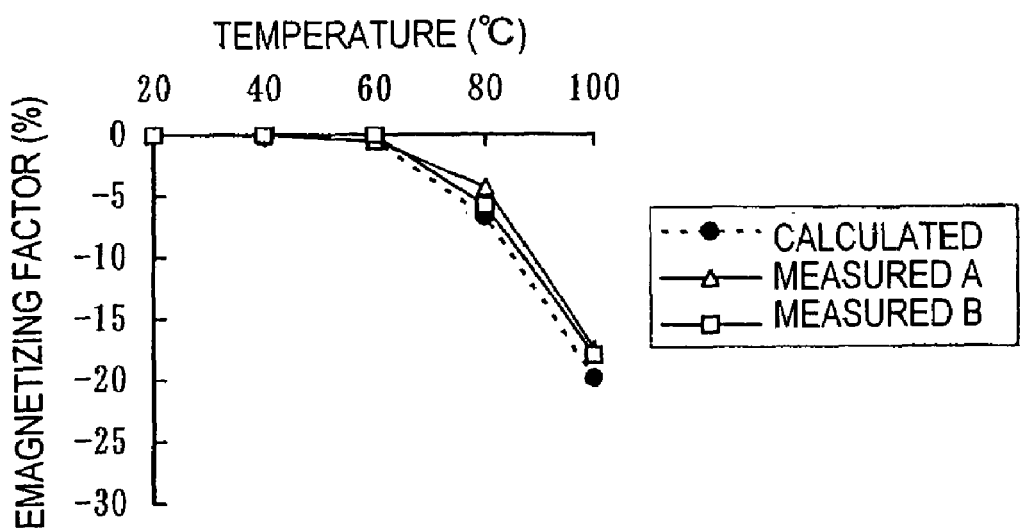

The following Table 1 summarizes these results:

As can be seen from FIG. 8 and Table 1, the calculated values and actually measured values matched with each other very closely. Among other things, the difference between the calculated and actually measured demagnetizing factors was just about 2%. Thus, the present inventors confirmed that the demagnetization phenomenon could be analyzed highly precisely according to the present invention.

Next, the calculated and measured magnetic flux density distributions will be described.

Figure 9:
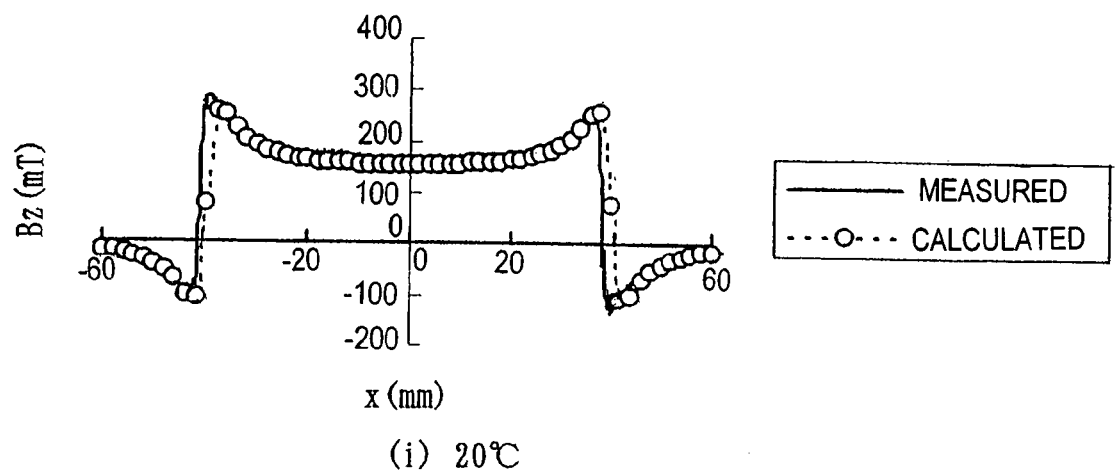
FIG. 9(i) is a graph showing the magnetic flux density distribution at the center of a magnet at 20° C., and FIG. 9(ii) is a graph showing the magnetic flux density distribution at the center of the magnet at 100° C.
Figure 9:
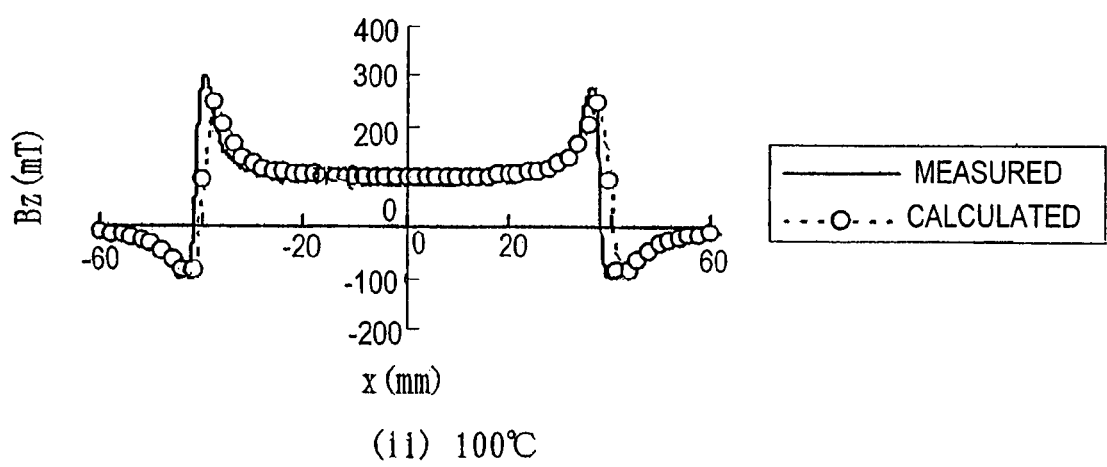
Figure 10:
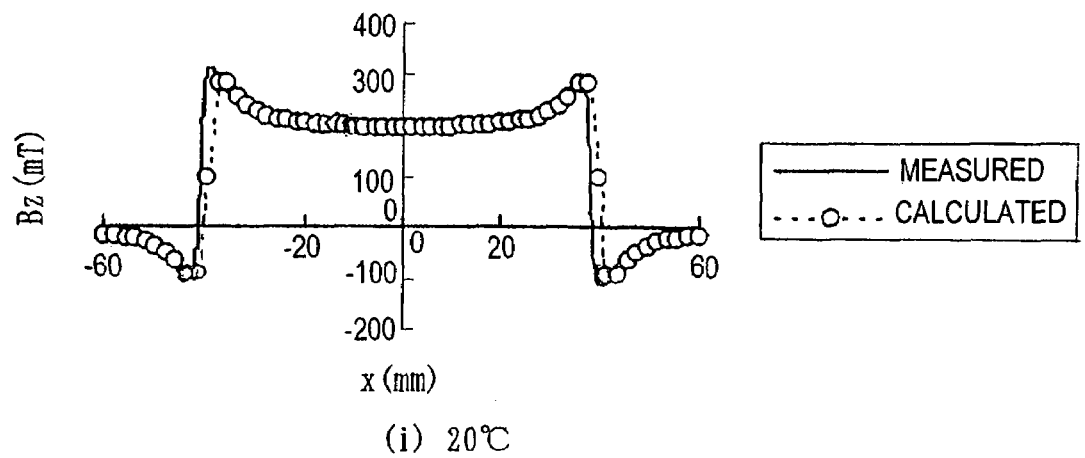
FIG. 10(i) is a graph showing the magnetic flux density distribution near the surface of a magnet at 20° C., and FIG. 10(ii) is a graph showing the magnetic flux density distribution near the surface of the magnet at 100° C.
Figure 10:
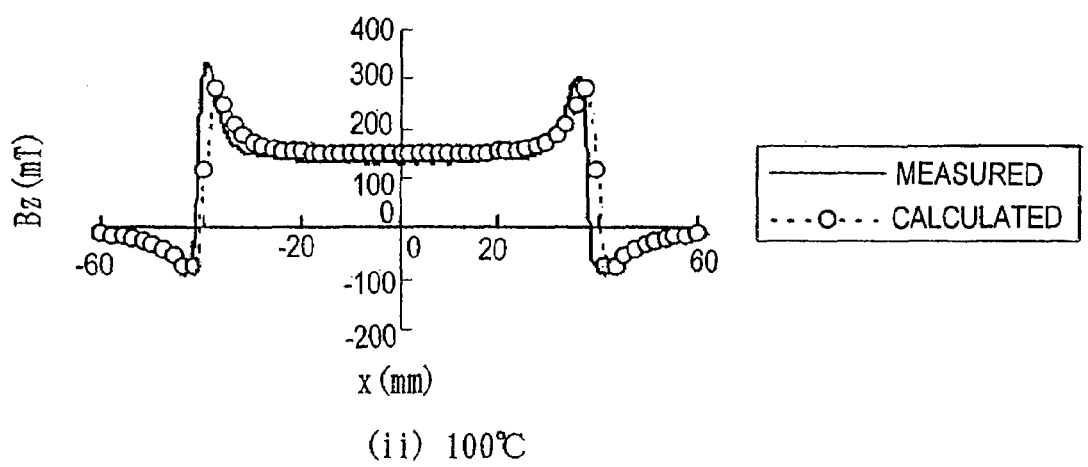

FIG. 9(i) shows 20° C. magnetic flux density distributions for the center portion of the magnet shown in FIG. 7, while FIG. 9(ii) shows 100° C. magnetic flux density distributions for the same center portion of the magnet. FIG. 10(i) shows 20° C. magnetic flux density distributions near one edge of the magnet, while FIG. 10(ii) shows 100° C. magnetic flux density distributions for the same edge of the magnet.

As is clear from FIGS. 9 and 10, the calculated post-demagnetization magnetic flux density distributions were found very closely matching with the actually measured ones.

Also, comparing the portions (i) and (ii) of FIG. 9 or 10, it can be seen that the magnetic flux density at both edges of the magnet hardly decreased even at 100° C. but that the magnetic flux density at the center portion thereof decreased noticeably. That is to say, the present inventors confirmed, by calculations and actual measurements, that in the same sample magnet, thermal demagnetization hardly occurred even at 100° C. in portions with relatively large permeance coefficients (e.g., portions near the edges of the magnet) but was produced significantly in portions with relatively small permeance coefficients (e.g., the center portion of the magnet).

According to the present invention, post-thermal-demagnetization B-H curves are redefined (i.e., modified) for respective very small elements of a permanent magnet, thereby enabling post-demagnetization magnetic field analysis, which has never been carried out in the prior art. That is to say, not just the probability of occurrence of demagnetization in a permanent magnet is estimated but also the magnetic flux density distribution after the demagnetization can be calculated as well. Thus, a magnetic circuit can be fabricated at a reduced cost by selecting appropriate permanent magnets.

What is claimed is:

1. A magnetic field analysis method comprising the steps of:
    calculating permeance coefficients at multiple sites in a permanent magnet and/or numerical values that are dependent on the permeance coefficients based on B-H curve data of the permanent magnet at a first temperature T1; and
    deriving modified B-H curve data of the permanent magnet, which has been operated at a second temperature T2 that is different from the first temperature T1, for the

TABLE 1

|  | Calculated | | Measured A | | Measured B | |
| --- | --- | --- | --- | --- | --- | --- |
| Temp. (° C.) | Flux (mWb) | Demagnetizing Factor (%) | Flux (mWb) | Demagnetizing Factor (%) | Flux (mWb) | Demagnetizing Factor (%) |
| 20 | 0.386 | 0 | 0.399 | 0 | 0.4 | 0 |
| 40 | 0.386 | 0 | 0.399 | 0 | 0.4 | 0 |
| 60 | 0.384 | −0.5 | 0.397 | −0.5 | 0.4 | 0 |
| 80 | 0.36 | −6.7 | 0.382 | −4.3 | 0.377 | −5.8 |
| 100 | 0.309 | −19.9 | 0.329 | −17.5 | 0.328 | −18 | respective sites based on B-H curve data of the permanent magnet at the second temperature T2 and the permeance coefficients or the numerical values.

2. The magnetic field analysis method of claim 1, comprising the step of deriving the modified B-H curve data at a third temperature that is different from the second temperature T2.

3. The method of claim 1, further comprising the step of storing the modified B-H curve data in a memory of a calculator.

4. A magnetic field analyzer comprising memory means for storing B-H curve data of a selected permanent magnet at multiple temperatures and computing means,
wherein the computing means carries out the steps of:
calculating permeance coefficients at multiple sites in the permanent magnet and/or numerical values that are dependent on the permeance coefficients based on B-H curve data of the permanent magnet at a first temperature T1 as stored in the memory means; and
deriving modified B-H curve data of the permanent magnet, which has been operated at a second temperature T2 that is different from the first temperature T1, for the respective sites based on B-H curve data of the permanent magnet at the second temperature T2 and the permeance coefficients or the numerical values as stored in the memory means.

5. The magnetic field analyzer of claim 4, wherein the computing means stores the modified B-H curve data in the memory means.

6. A magnetic field analysis program, which is defined so as to make a computer carry out the steps of:
calculating permeance coefficients at multiple sites in a permanent magnet and/or numerical values that are dependent on the permeance coefficients based on B-H curve data of the permanent magnet at a first temperature T1; and
deriving modified B-H curve data of the permanent magnet, which has been operated at a second temperature T2 that is different from the first temperature T1, for the respective sites based on B-H curve data of the permanent magnet at the second temperature T2 and the permeance coefficients or the numerical values.

7. The magnetic field analysis program of claim 6, which makes the computer carry out the step of deriving the modified B-H curve data at a third temperature that is different from the second temperature T2.

8. The magnetic field analysis program of claim 6, which makes the computer further carry out the step of storing the modified B-H curve data in a memory of a calculator.

9. An additional module program for magnetic field analysis, wherein a magnetic field analysis program makes a computer carry out the steps of:
calculating permeance coefficients at multiple sites in a permanent magnet and/or numerical values that are dependent on the permeance coefficients based on B-H curve data of the permanent magnet at a first temperature T1; and then
deriving modified B-H curve data of the permanent magnet, which has been operated at a second temperature T2 that is different from the first temperature T1, for the respective sites based on B-H curve data of the permanent magnet at the second temperature T2 and the permeance coefficients or the numerical values.

10. The additional module program for magnetic field analysis of claim 9, which makes the computer carry out the step of deriving the modified B-H curve data at a third temperature that is different from the second temperature T2.

11. The additional module program for magnetic field analysis of claim 9, which makes the computer further carry out the step of storing the modified B-H curve data in a memory of a calculator.

12. A method for producing a magnetic circuit, the method comprising the steps of:
doing a magnetic field analysis on a magnetic circuit, including multiple permanent magnets that have been demagnetized at the second temperature T2, by the magnetic field analysis method of claim 1; and
making the magnetic circuit, including selected one of the permanent magnets, based a result of the magnetic field analysis.

* * * * *